US012588534B2

(12) United States Patent
Yamamoto

(10) Patent No.: US 12,588,534 B2
(45) Date of Patent: Mar. 24, 2026

(54) DENSITY DISTRIBUTION OF CONDUCTIVE BUMPS ON WAFER

(71) Applicant: SHINKO ELECTRIC INDUSTRIES CO., LTD., Nagano (JP)

(72) Inventor: Kengo Yamamoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 720 days.

(21) Appl. No.: 17/816,805

(22) Filed: Aug. 2, 2022

(65) Prior Publication Data

US 2023/0054800 A1     Feb. 23, 2023

(30) Foreign Application Priority Data

Aug. 23, 2021     (JP) ................................. 2021-135446

(51) Int. Cl.
H01L 23/00          (2006.01)
H10W 72/00          (2026.01)
          (Continued)

(52) U.S. Cl.
CPC .. H10W 72/0198 (2026.01); H10W 72/01235 (2026.01); H10W 72/01238 (2026.01);
          (Continued)

(58) Field of Classification Search
CPC ......................... H01L 2224/141–14183; H01L 2224/171–17183; H01L 2224/14515–14519; H01L 2224/17515–17519; H01L 2224/16221–16268; H01L 2224/0951–09519; H01L 2224/1451–14519; H01L 2224/1751; H01L 2224/17519; H01L 2224/16145–16148; H01L 2224/06132; H01L 2224/06142; H01L 2224/06152;
(Continued)

(56) References Cited

U.S. PATENT DOCUMENTS 6,107,685 A * 8/2000 Nishiyama .............. H01L 24/16
                                                        257/737
9,905,527 B1 * 2/2018 Hacker ................... H01L 24/11
(Continued)

FOREIGN PATENT DOCUMENTS

| JP | 2005-093461 | 4/2005 |
| JP | 2013-168453 | 8/2013 |
| KR | 10-2001-0040082 | 5/2001 |

OTHER PUBLICATIONS

Office Action mailed on Jan. 28, 2025 with respect to the corresponding Japanese patent application No. 2021-135446.
(Continued)

*Primary Examiner* — Julio J Maldonado
*Assistant Examiner* — Eric Manuel Mulero Flores
(74) *Attorney, Agent, or Firm* — IPUSA, PLLC

(57)          ABSTRACT

A wafer includes a substrate and conductive bumps on a surface of the substrate. In a plan view from a direction perpendicular to the surface of the substrate, the area density of the conductive bumps is higher in a first area than in a second area around the first area in the surface of the substrate. The first area has effective chip areas arranged therein.

11 Claims, 14 Drawing Sheets

(51) Int. Cl.
H10W 72/20 (2026.01)
H10W 72/90 (2026.01)

(52) U.S. Cl.
CPC .... *H10W 72/01253* (2026.01); *H10W 72/222* (2026.01); *H10W 72/232* (2026.01); *H10W 72/248* (2026.01); *H10W 72/252* (2026.01); *H10W 72/90* (2026.01); *H10W 72/9445* (2026.01); *H10W 72/952* (2026.01)

(58) Field of Classification Search
CPC . H01L 2224/06133; H01L 2224/06143; H01L 2224/06153; H01L 2224/25171; H01L 2224/09132; H01L 2224/09133; H01L 2224/09152; H01L 24/06; H01L 24/09; H01L 24/14; H01L 24/18; H01L 2924/15311; H01L 2924/15312; H01L 2924/15331; H01L 2924/15332; H01L 2224/09142; H01L 2224/09143; H10W 72/019–0198; H10W 72/241–248; H10W 90/721–7295; H10P 58/20–22; H10P 54/20–94

See application file for complete search history.

(56) References Cited

U.S. PATENT DOCUMENTS

| | | | |
|---|---|---|---|
| 9,911,709 B1 * | 3/2018 | Zhuang | H01L 24/17 |
| 2003/0071329 A1 | 4/2003 | Cox et al. | |
| 2004/0135233 A1 | 7/2004 | Cox et al. | |
| 2007/0045830 A1 | 3/2007 | Cox et al. | |
| 2013/0207259 A1 | 8/2013 | Yutani et al. | |
| 2020/0020655 A1 * | 1/2020 | Tsai | H01L 24/11 |
| 2022/0013502 A1 * | 1/2022 | Lee | H01L 23/5385 |

OTHER PUBLICATIONS

Office Action mailed on Nov. 18, 2025 issued with respect to the corresponding Korean patent application No. 10-2022-0099076.

* cited by examiner

DENSITY DISTRIBUTION OF CONDUCTIVE BUMPS ON WAFER

CROSS-REFERENCE TO RELATED APPLICATION

This application is based upon and claims the benefit of priority of Japanese Patent Application No. 2021-135446, filed on Aug. 23, 2021, the entire contents of which are incorporated herein by reference.

FIELD

A certain aspect of the embodiments discussed herein is related to wafers.

BACKGROUND

As a method of manufacturing a wafer used for manufacturing a semiconductor device, forming electrode pads on a substrate having an effective area and an ineffective area and thereafter forming conductive bumps by electroplating is known. The effective area is an area where effective chips are arranged, and the ineffective area is provided around the effective area. The conductive bumps are formed in both the effective area and the ineffective area, in substantially the same size and with substantially the same pitch. (See Japanese Laid-open Patent Publication No. 2013-168453.)

SUMMARY

According to an aspect of the present invention, a wafer includes a substrate and conductive bumps on a surface of the substrate. In a plan view from a direction perpendicular to the surface of the substrate, the area density of the conductive bumps is higher in a first area than in a second area around the first area in the surface of the substrate. The first area has effective chip areas arranged therein.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
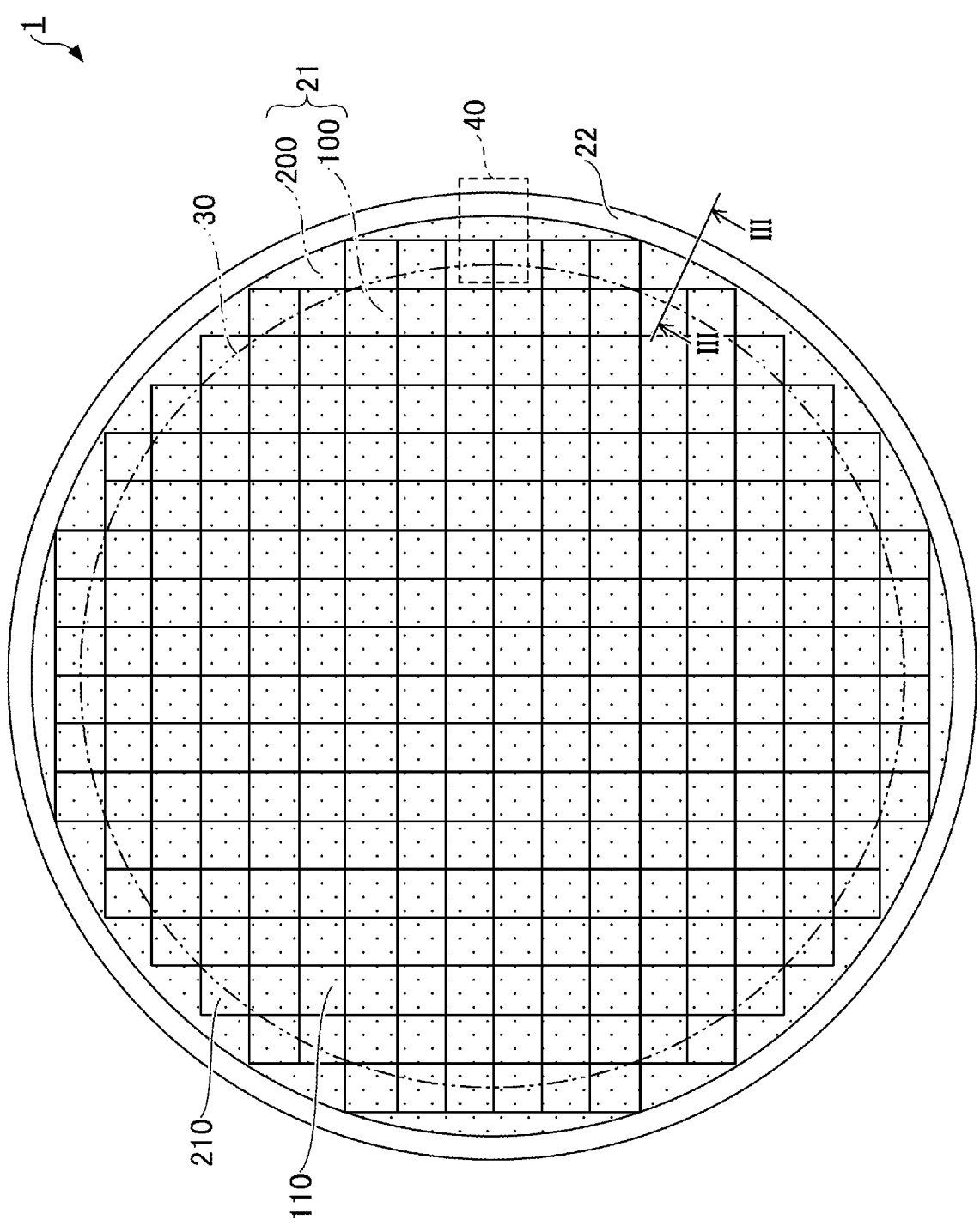
FIG. 1 is a top plan view of a wafer according to a first embodiment.

In the case of forming conductive bumps using a subtractive process, a resist layer is removed after plating. According to conventional wafers, however, even after performing processing to remove the resist layer, the resist layer may remain in the ineffective area.

Thus, it is desired to provide a wafer that can reduce the remaining of a resist layer used for forming conductive bumps.

According to an embodiment, it is possible to reduce the remaining of a resist layer used for forming conductive bumps.

The inventor of the present invention has conducted a serious study to identify the cause of the remaining of a resist layer in the ineffective area in conventional wafers. As a result, it has been found that according to conventional wafers, because no conductive bumps are formed outside the ineffective area, current density is higher in the ineffective area than in the effective area when forming conductive bumps by electroplating, so that conductive bumps famed in the ineffective area are likely to be taller than conductive bumps formed in the effective area. As conductive bumps become taller, the swelling of the resist layer is more likely to be hindered so that the resist layer is less likely to be removed when removing the resist layer.

Thus, the formation of taller conductive bumps in the ineffective area makes the resist layer more likely to remain.

Based on these findings, the inventor of the present invention has arrived at the following embodiments.

Embodiments are described below with reference to the accompanying drawings. In the present specification and drawings, the same elements having substantially the same functional configuration are referred to using the same reference numeral, and a duplicate description thereof may be omitted.

[a] First Embodiment

A first embodiment is described. The first embodiment relates to a wafer.

Figure 2:
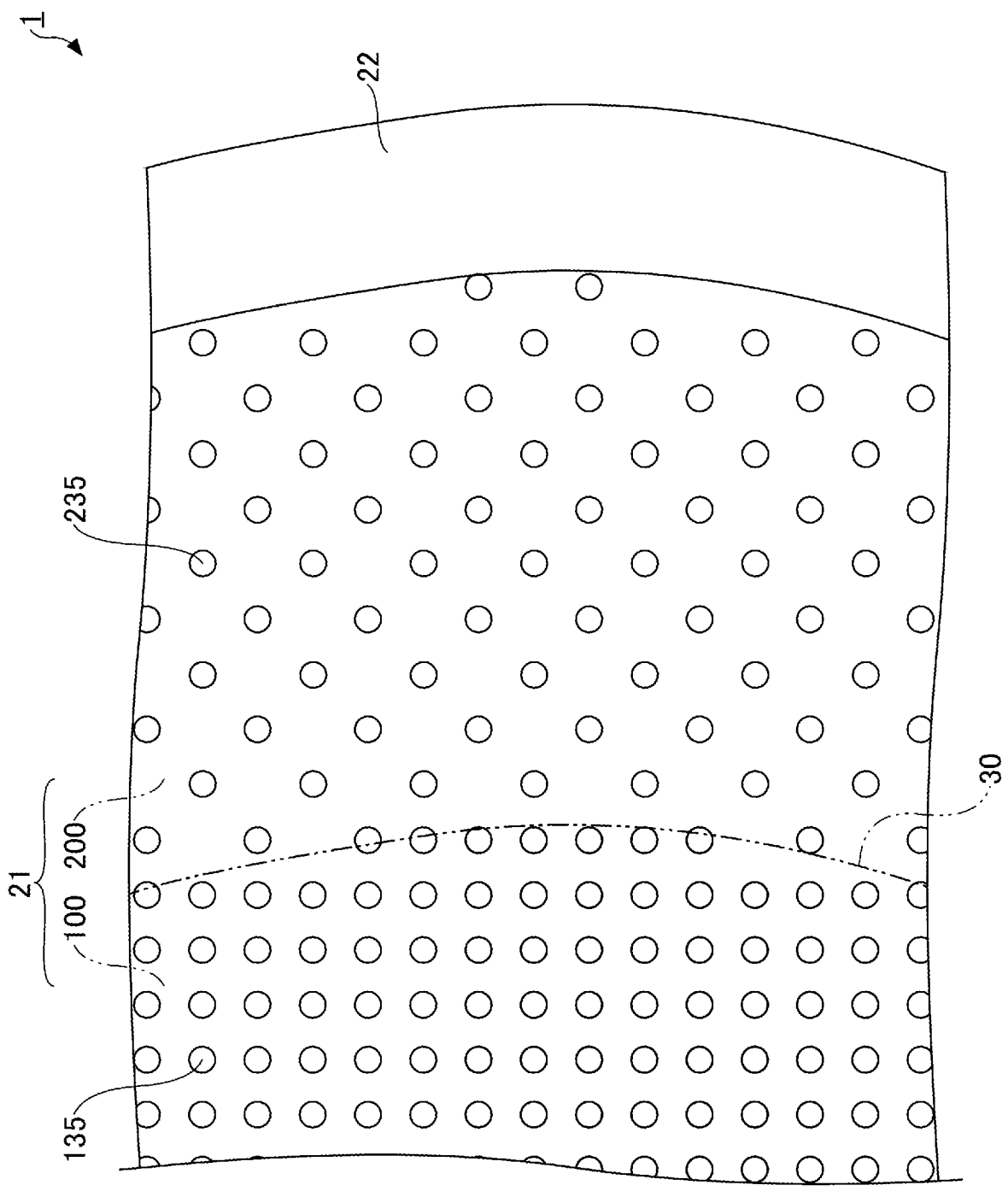
FIG. 2 is another top plan view of the wafer according to the first embodiment.
Figure 3:
FIG. 3 is a sectional view of the wafer according to the first embodiment.
Figure 4:
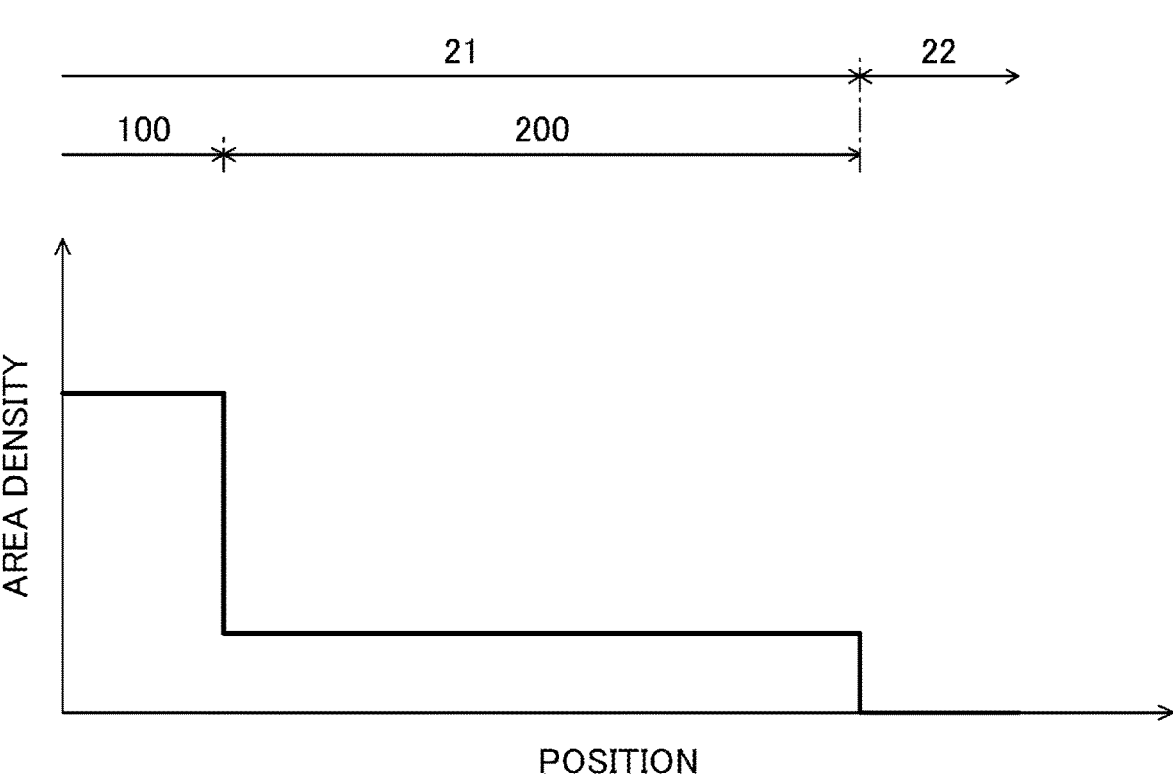
FIG. 4 is a diagram illustrating a distribution of area densities of conductive bumps in the wafer according to the first embodiment.

First, a configuration of a wafer is described. FIGS. 1 and 2 are plan views of a wafer according to the first embodiment. FIG. 2 is an enlarged view of an area 40 of FIG. 1. FIG. 3 is a sectional view of the wafer according to the first embodiment, taken along the line of FIG. 1. FIG. 4 is a diagram illustrating a distribution of area densities of conductive bumps in the wafer according to the first embodiment.

Referring to FIGS. 1 and 2, a wafer 1 according to the first embodiment includes a substrate 10, first conductive bumps 135, and second conductive bumps 235. According to the present disclosure, for convenience, the first and second conductive bumps 135 and 235 side of the wafer 1 is referred to as the upper side or the first side, and the opposite side of the wafer 1 is referred to as the lower side or the second side. Furthermore, the surface of the wafer 1 on the first and second conductive bumps 135 and 235 side is referred to as the first surface or the upper surface, and the surface of the wafer 1 on the other side is referred to as the second surface or the lower surface.

The substrate 10 includes a circuit formation surface 11 on which a circuit is formed. The diameter of the substrate 10 is, for example, 300 mm (12 in.) or 200 mm (8 in.). The first conductive bumps 135 and the second conductive bumps 235 are provided on the circuit formation surface 11. According to the present disclosure, a plan view refers to a view of an object from a direction normal to the circuit formation surface 11 of the wafer 1, and a planar shape refers to a shape of an object as viewed from a direction normal to the circuit formation surface 11 of the wafer 1. The circuit formation surface 11 is an example of the first surface.

The substrate 10 includes a bump formation area 21 and a bump non-formation area 22 provided around the bump formation area 21. Below-described conductive bumps are formed in the bump formation area 21, while no conductive bumps are formed in the bump non-formation area 22. The radial dimension (width) of the bump non-formation area 22 is, for example, approximately 1.5 mm. The bump formation area 21 includes an effective area 100 where effective chip areas 110 are arranged and an ineffective area 200 provided around the effective area 100. The effective chip areas 110 are arranged in arrays in a plan view. The effective chip areas 110 are within a boundary 30 between the effective area 100 and the ineffective area 200. Chip areas on the boundary 30 are determined as ineffective chip areas 210. Semiconductor chips cut out of the effective chip areas 110 by dicing are determined as products, and semiconductor chips cut out of the ineffective chip areas 210 are not determined as products. The radial dimension (width) of the ineffective area 200 is, for example, approximately 3 mm to approximately 10 mm. The effective area 100 is an example of a first area, and the ineffective area 200 is an example of a second area.

The substrate 10 includes, for example, a semiconductor substrate made of silicon or the like and a semiconductor integrated circuit, etc., formed on the semiconductor substrate. Referring to FIG. 3, first electrode pads 130 and second electrode pads 230 are provided on the substrate 10. The first electrode pads 130 are provided in the effective area 100, and the second electrode pads 230 are provided in the ineffective area 200. The first electrode pads 130 are connected to the semiconductor integrated circuit, while the second electrode pads 230 are not connected to the semiconductor integrated circuit. The first electrode pads 130 and the second electrode pads 230 are made of, for example, aluminum (Al).

In a plan view, the area density of the second electrode pads 230 in the ineffective area 200 is lower than, for example, approximately 25% of, the area density of the first electrode pads 130 in the effective area 100. Furthermore, in a plan view, the pitch of the second electrode pads 230 in the ineffective area 200 is larger than, for example, approximately 200% of, the pitch of the first electrode pads 130 in the effective area 100. In a plan view, the area density and the pitch of the second electrode pads 230 are substantially uniform throughout the ineffective area 200. For example, the pitch of the first electrode pads 130 ranges from 10 µm to 100 µm, and the pitch of the second electrode pads 230 ranges from 20 µm to 200 µm. In a plan view, each of the first electrode pads 130 and each of the second electrode pads 230 may be equal in equivalent circle diameter. In a plan view, the number density of the second electrode pads 230 in the ineffective area 200 is lower than the number density of the first electrode pads 130 in the effective area 100. Here, the area density of pads refers to the ratio of the area occupied by pads to unit area. The number density of pads refers to the number of pads included in unit area. The pitch of pads refers to the distance between the centers of adjacent pads in a plan view.

The first conductive bumps 135 are provided one on each first electrode pad 130 in the effective area 100. The first conductive bumps 135 each include a first seed layer 131, a first copper (Cu) layer 132, and a first solder layer 133.

The first seed layer 131 directly contacts the first electrode pad 130. The material of the first seed layer 131 is, for example, copper, titanium (Ti), chromium (Cr), tungsten (W), or an alloy of any combination thereof. The first seed layer 131 may include layers of films, and the material of each film may be, for example, copper, titanium, chromium, tungsten, or an alloy of any combination thereof. The thickness of the first seed layer 131 is, for example, approximately 0.01 µm to approximately 0.3 µm. The planar shape of the first seed layer 131 is, for example, substantially circular. In this case, the diameter of the first seed layer 131 is, for example, approximately 5 µm to approximately 100 µm, and preferably, approximately 10 µm to approximately 20 µm.

The first copper layer 132 has a pillar shape such as a cylindrical shape. The first copper layer 132 is an electroplating layer and directly contacts the first seed layer 131. The thickness of the first copper layer 132 is, for example, approximately 10 µm to approximately 200 µm, and preferably, approximately 20 µm to approximately 150 µm. The first copper layer 132 has substantially the same planar shape as the first seed layer 131. The first copper layer 132 is so formed as to be superposed on the first seed layer 131 in a plan view. The first copper layer 132 is an example of a (first) copper pillar.

The first solder layer 133 directly contacts the first copper layer 132. The shape of the first solder layer 133 is, for example, a dome shape. Here, the dome shape refers to a shape whose height decreases from near the center toward the periphery. The thickness of the first solder layer 133 (the maximum thickness near the center) is, for example, approximately 10 µm. The first solder layer 133 has substantially the same planar shape as the first copper layer 132. The first solder layer 133 is so formed as to be superposed on the first copper layer 132 in a plan view. The material of the first solder layer 133 is, for example, an alloy containing lead (Pb), an alloy of tin (Sn) and copper, an alloy of tin and silver (Ag), an alloy of tin, silver, and copper, or the like.

The height of the first conductive bumps 135 is, for example, approximately 10 µm to approximately 200 µm. The first solder layer 133 is optional. Another metallic layer such as a nickel (Ni) layer may be provided between the first copper layer 132 and the first solder layer 133.

The second conductive bumps 235 are provided one on each second electrode pad 230 in the ineffective area 200. The second conductive bumps 235 each include a second seed layer 231, a second copper layer 232, and a second solder layer 233.

The second seed layer 231 directly contacts the second electrode pad 230. The material of the second seed layer 231 may be the same as the material of the first seed layer 131. The thickness of the second seed layer 231 is, for example, approximately 0.01 µm to approximately 0.3 µm. The planar shape of the second seed layer 231 is, for example, substantially circular. In this case, the diameter of the second seed layer 231 is, for example, approximately 5 µm to approximately 100 µm, and preferably, approximately 10 µm to approximately 20 µm.

The second copper layer 232 has a pillar shape such as a cylindrical shape. The second copper layer 232 is an electroplating layer and directly contacts the second seed layer 231. The thickness of the second copper layer 232 is, for example, approximately 10 µm to approximately 200 µm, and preferably, approximately 20 μm to approximately 150 μm. The second copper layer 232 has substantially the same planar shape as the second seed layer 231. The second copper layer 232 is so formed as to be superposed on the second seed layer 231 in a plan view. The second copper layer 232 is an example of a (second) copper pillar.

The second solder layer 233 directly contacts the second copper layer 232. The shape of the second solder layer 233 is, for example, a dome shape. The thickness of the second solder layer 233 (the maximum thickness near the center) is, for example, approximately 10 μm. The second solder layer 233 has substantially the same planar shape as the second copper layer 232. The second solder layer 233 is so formed as to be superposed on the second copper layer 232 in a plan view. The material of the second solder layer 233 may be the same as the material of the first solder layer 133.

The height of the second conductive bumps 235 is, for example, approximately 10 μm to approximately 200 μm. The second solder layer 233 is optional. Another metallic layer such as a nickel layer may be provided between the second copper layer 232 and the second solder layer 233.

As described above, in a plan view, the area density of the second electrode pads 230 in the ineffective area 200 is lower than, for example, approximately 25% of, the area density of the first electrode pads 130 in the effective area 100. Therefore, as illustrated in FIGS. 2 through 4, in a plan view, the area density of the second conductive bumps 235 in the ineffective area 200 is lower than, for example, approximately 25% of, the area density of the first conductive bumps 135 in the effective area 100. Furthermore, in a plan view, the pitch of the second conductive bumps 235 in the ineffective area 200 is larger than, for example, approximately 200% of, the pitch of the first conductive bumps 135 in the effective area 100. In a plan view, the area density and the pitch of the second conductive bumps 235 are substantially uniform throughout the ineffective area 200. For example, the pitch of the first conductive bumps 135 ranges from 10 μm to 100 μm, and the pitch of the second conductive bumps 235 ranges from 20 μm to 200 μm. In a plan view, each of the first conductive bumps 135 and each of the second conductive bumps 235 may be equal in equivalent circle diameter. In a plan view, the number density of the second conductive bumps 235 in the ineffective area 200 is lower than the number density of the first conductive bumps 135 in the effective area 100.

Next, a method of manufacturing the wafer 1 according to the first embodiment is described. FIGS. 5A through 5F are sectional views illustrating a method of manufacturing a wafer according to the first embodiment. FIGS. 5A through 5F correspond to sectional views taken along the line in FIG. 1.

Figure 5A:
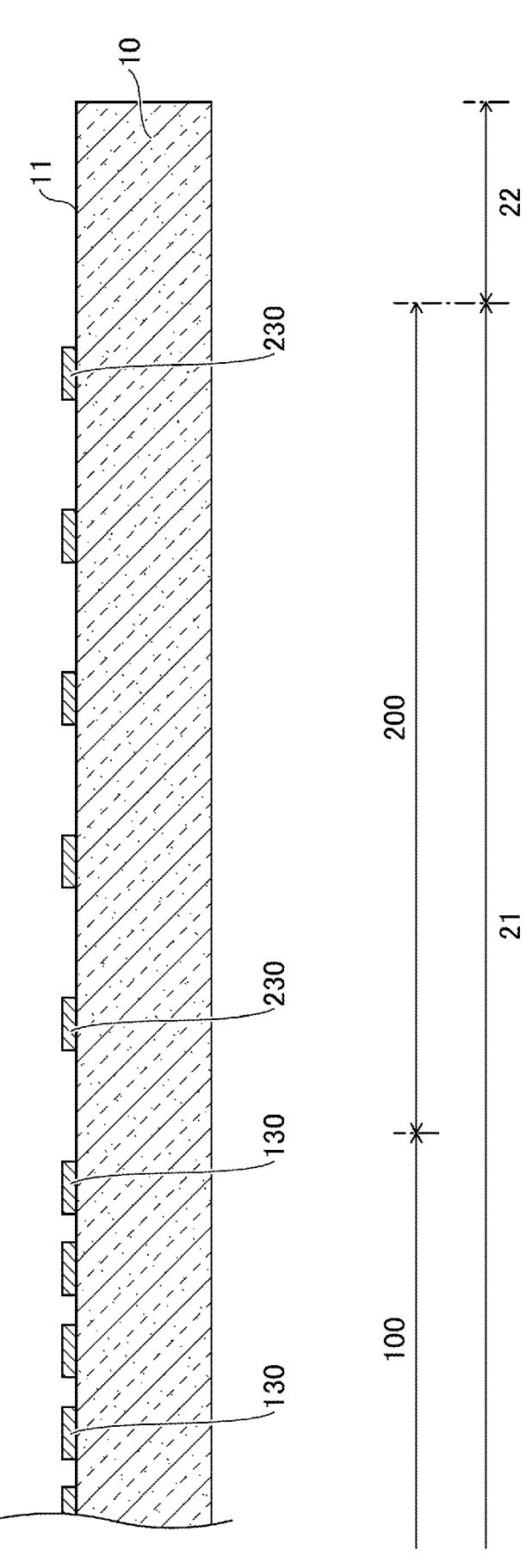
FIGS. 5A through 5F are sectional views illustrating a method of manufacturing a wafer according to the first embodiment.

First, as illustrated in FIG. 5A, the substrate 10 having first electrode pads 130 and the second electrode pads 230 formed on the circuit formation surface 11 is prepared.

Figure 5B:
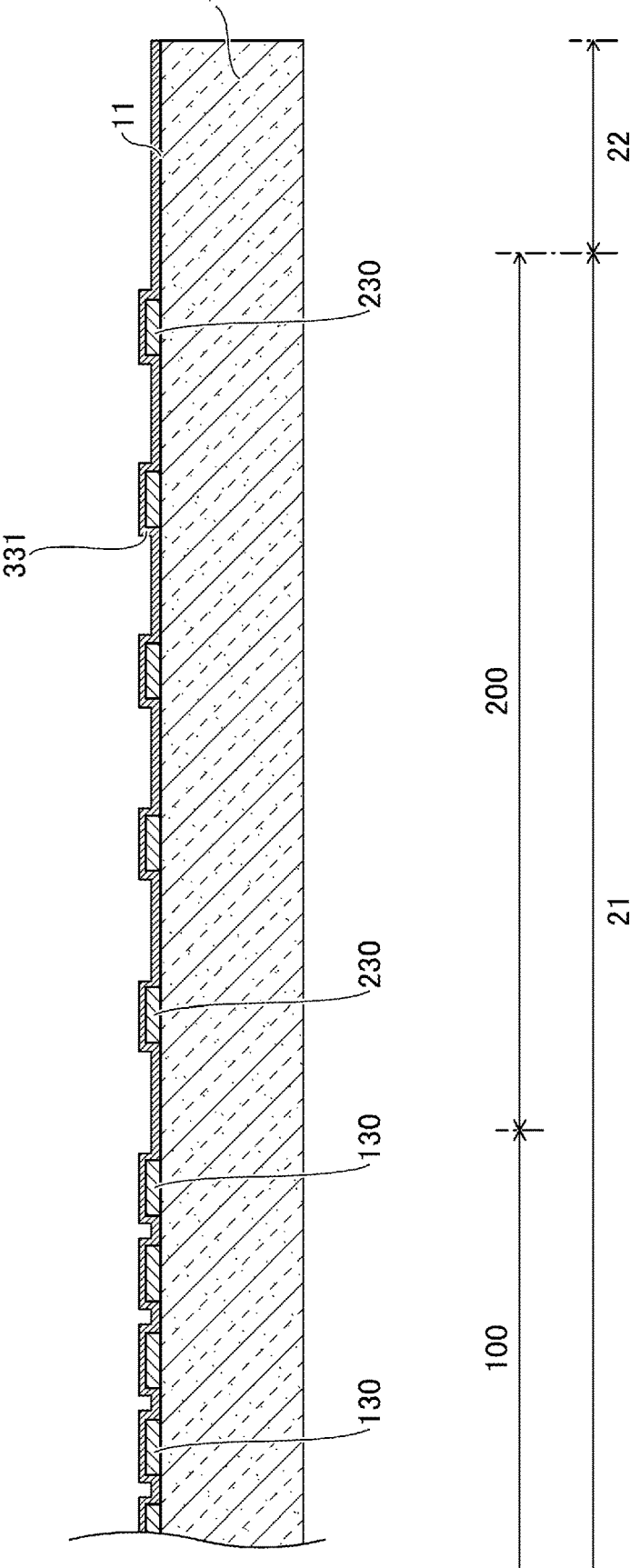

Next, as illustrated in FIG. 5B, a seed layer 331 is so formed on the substrate 10 as to cover the first electrode pads 130 and the second electrode pads 230. The seed layer 331 is a layer to later become the first seed layer 131 and the second seed layer 231. The material of the seed layer 331 is the same as the material of the first seed layer 131 and the second seed layer 231. The thickness of the seed layer 331 is equal to the thickness of the first seed layer 131 and the second seed layer 231. The seed layer 331 may be formed by sputtering or electroless plating.

Figure 5C:
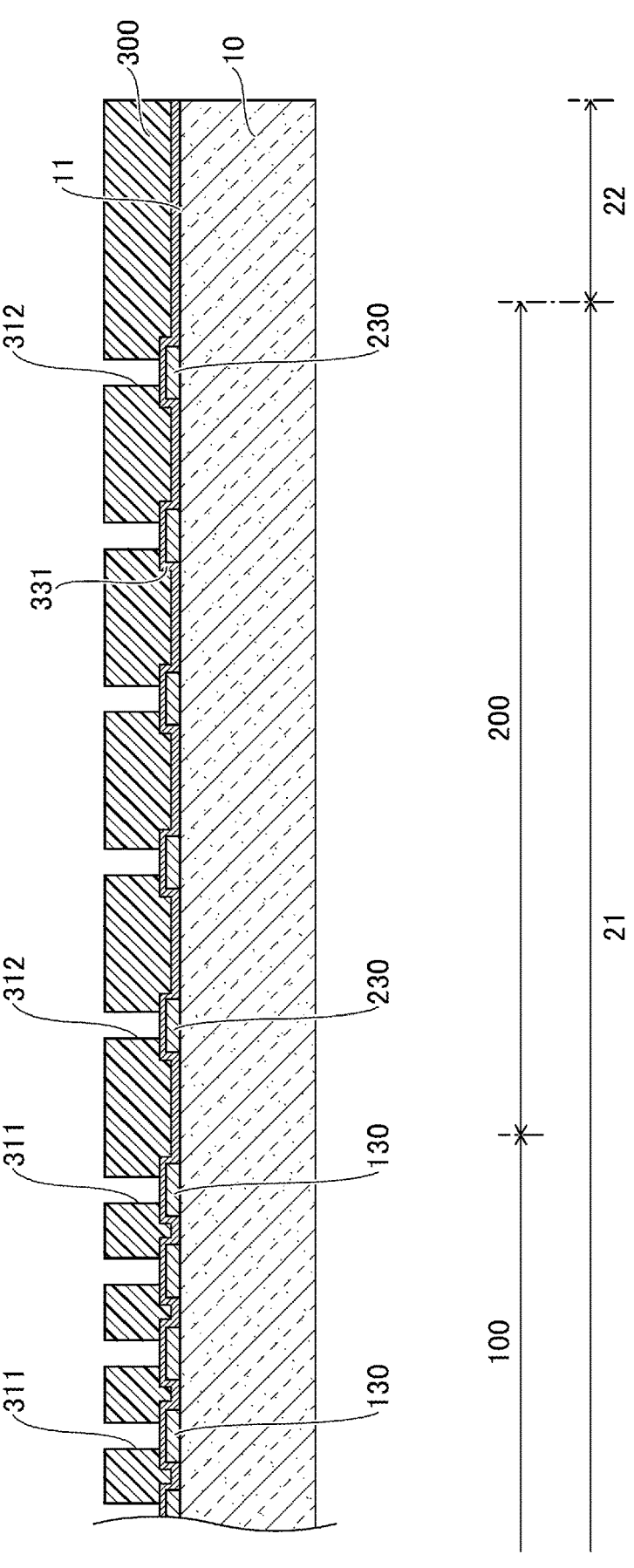

Next, as illustrated in FIG. 5C, a resist layer 300 is formed on the seed layer 331. Specifically, for example, the seed layer 331 is laminated with, for example, a dry film resist made of a photosensitive resin as the resist layer 300. Then, the resist layer 300 is patterned through exposure to light and development to form first openings 311 and second openings 312 in the resist layer 300. The first openings 311 and the second openings 312 are so formed as to expose the seed layer 331. The first openings 311 are formed at positions where the first conductive bumps 135 are to be formed in the effective area 100. The second openings 312 are formed at positions where the second conductive bumps 235 are to be formed in the ineffective area 200. The thickness of the resist layer 300 is greater than the height of the first conductive bumps 135 and the second conductive bumps 235 to be formed, and is, for example, approximately 20 μm to approximately 210 μm.

Figure 5D:
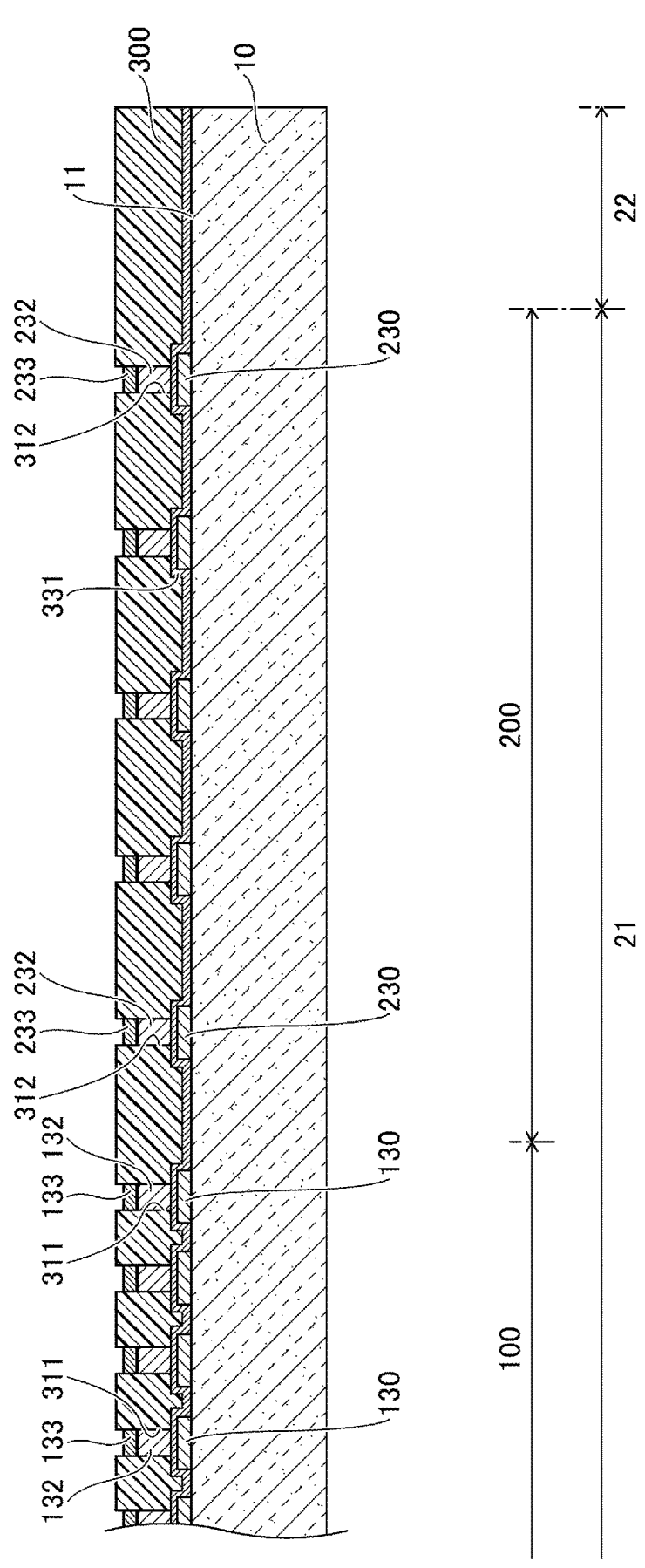

Next, as illustrated in FIG. 5D, by performing electroplating using the seed layer 331 as a plating power supply path, the first copper layer 132 is famed on the seed layer 331 exposed in the first openings 311 and the second copper layer 232 is famed on the seed layer 331 exposed in the second openings 312. Next, by performing electroplating using the seed layer 331 as a plating power supply path, the first solder layer 133 is famed on the first copper layer 132, and the second solder layer 233 is formed on the second copper layer 232.

Figure 5E:
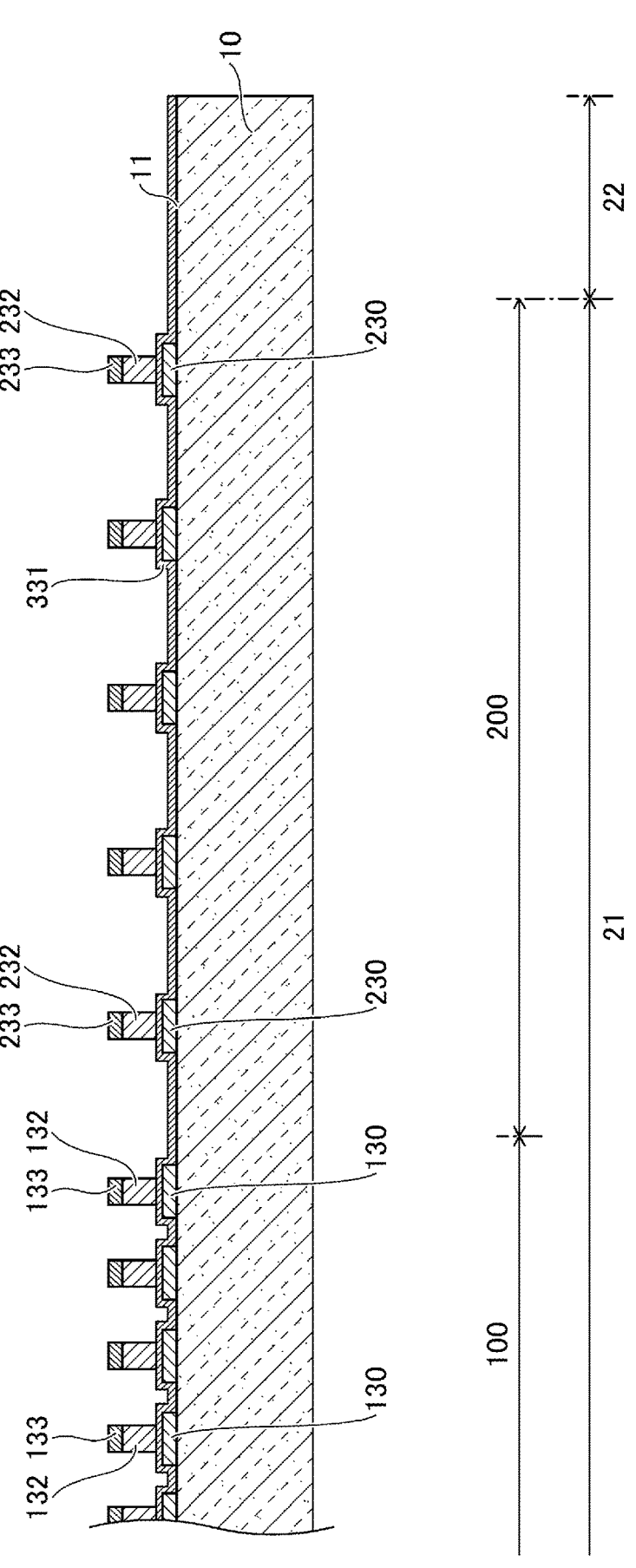

Next, as illustrated in FIG. 5E, the resist layer 300 is removed. The resist layer 300 may be removed using a stripper containing sodium hydroxide or the like, for example.

Figure 5F:
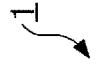

Next, as illustrated in FIG. 5F, a portion of the seed layer 331 that is not covered by the first solder layer 133 or the second solder layer 233 and exposed is removed using an etchant. Examples of etchants include etchants such as an aqueous solution containing hydrogen peroxide and sulfuric acid as main components, a sodium persulfate aqueous solution, an ammonium persulfate aqueous solution, and a nitric acid solution.

Next, the first solder layer 133 and the second solder layer 233 are subjected to a process such as reflow soldering to melt, and are thereafter solidified into a dome shape. Thus, the first conductive bumps 135 are formed on the first electrode pads 130 and the second conductive bumps 235 are formed on the second electrode pads 230.

The wafer 1 according to the first embodiment can be manufactured in this manner.

According to the wafer 1 of the first embodiment, the area density of the second electrode pads 230 in the ineffective area 200 is lower than the area density of the first electrode pads 130 in the effective area 100 in a plan view. Therefore, the area density of the second conductive bumps 235 in the ineffective area 200 is lower than the area density of the first conductive bumps 135 in the effective area 100 in a plan view. Accordingly, it is possible to suppress an excessive increase in current density in the ineffective area 200 when forming the first copper layer 132 and the second copper layer 232 and also when forming the first solder layer 133 and the second solder layer 233. Therefore, the height of the second conductive bumps 235 can be easily adjusted to the same height as the first conductive bumps 135. This allows the resist layer 300 to be easily swollen by a stripper when the resist layer 300 is removed, thus making it possible to reduce the remaining of the resist layer 300, used to form the first conductive bumps 135 and the second conductive bumps 235, in the ineffective area 200 as well.

Furthermore, because the second conductive bumps 235 are arranged at a lower density than the first conductive bumps 135, a stripper is likely to penetrate into the resist layer 300. In this respect as well, it is possible to reduce the remaining of the resist layer 300 in the ineffective area 200.

[b] Second Embodiment

Figure 6:
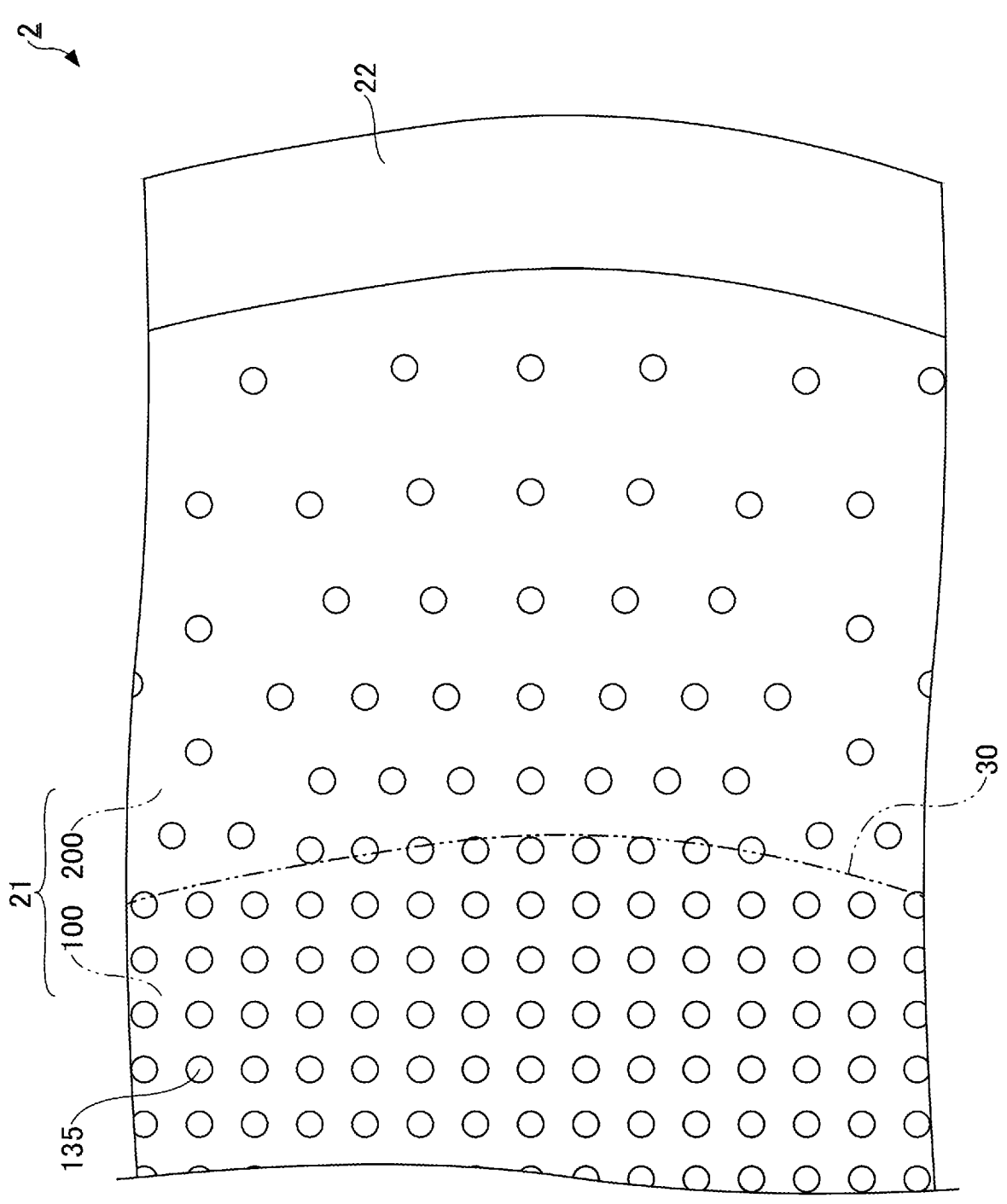
FIG. 6 is a top plan view of a wafer according to a second embodiment.
Figure 7:
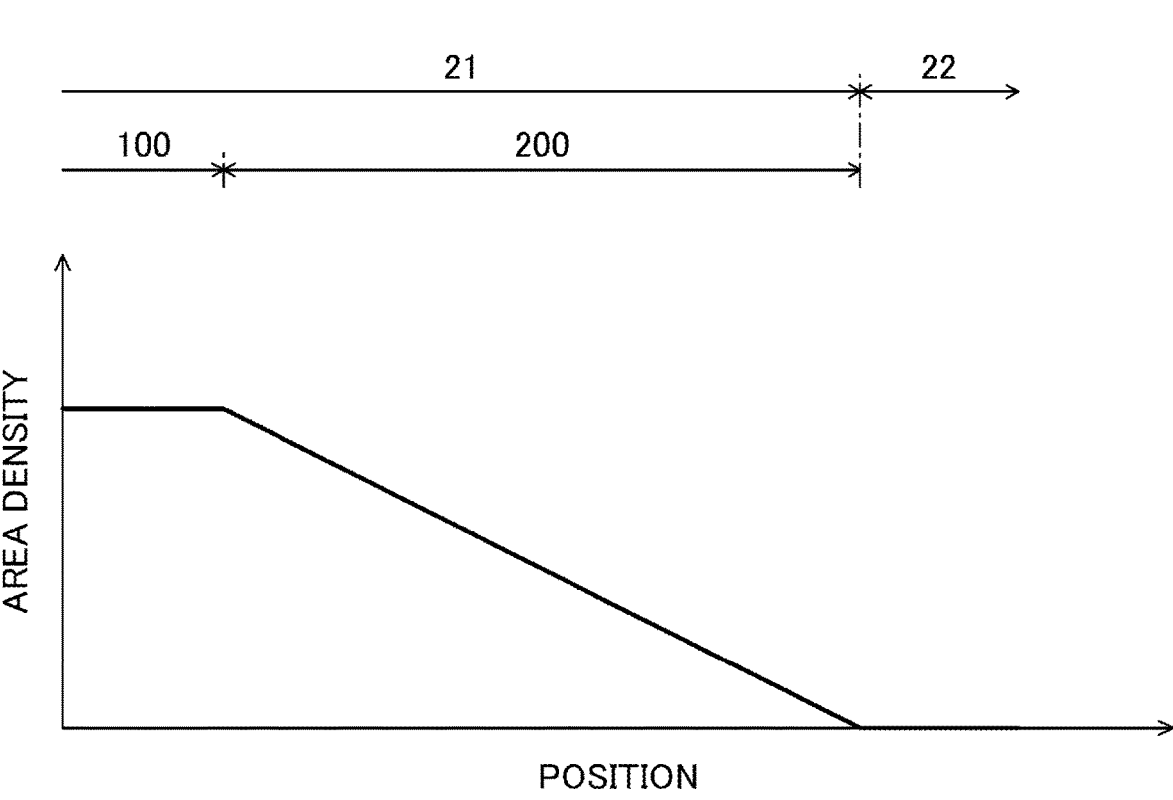
FIG. 7 is a diagram illustrating a distribution of area densities of conductive bumps in the wafer according to the second embodiment.

Next, a second embodiment is described. The second embodiment is different from the first embodiment in, for example, the arrangement of the second conductive bumps 235. FIG. 6 is a top plan view of a wafer 2 according to the second embodiment. FIG. 7 is a diagram illustrating a distribution of area densities of conductive bumps in the wafer 2 according to the second embodiment. FIG. 6 corresponds to the top plan view of FIG. 2.

Referring to FIGS. 6 and 7, in a plan view, the area density and the number density of the second electrode pads 230 and the area density and the number density of the second conductive bumps 235 in the ineffective area 200 continuously decrease as a distance from the effective area 100 increases. That is, in a plan view, the area density and the number density of the second electrode pads 230 and the area density and the number density of the second conductive bumps 235 in the ineffective area 200 continuously decrease in a radial direction of the substrate 10 (away from the effective area 100). For example, the area density and the number density of the second electrode pads 230 and the area density and the number density of the second conductive bumps 235 near the boundary 30 between the effective area 100 and the ineffective area 200 may be equal or approximately equal to the area density and the number density of the first electrode pads 130 and the area density and the number density of the first conductive bumps 135, respectively. Furthermore, for example, the area density and the number density of the second electrode pads 230 and the area density and the number density of the second conductive bumps 235 at the outer edge (periphery) of the ineffective area 200 may be substantially zero.

In other respects, the second embodiment may be equal to the first embodiment.

The second embodiment as well can produce the same effects as the first embodiment. Furthermore, because the area density and the number density of the second conductive bumps 235 continuously decrease as a distance from the effective area 100 increases, current density in the ineffective area 200 slowly changes when forming the first copper layer 132 and the second copper layer 232 and also when forming the first solder layer 133 and the second solder layer 233. Accordingly, the height of the second conductive bumps 235 can be more easily adjusted to the same or approximately the same height as the first conductive bumps 135. This makes it easier to reduce the remaining of the resist layer 300, which is used to form the first conductive bumps 135 and the second conductive bumps 235.

[c] Third Embodiment

Figure 8:
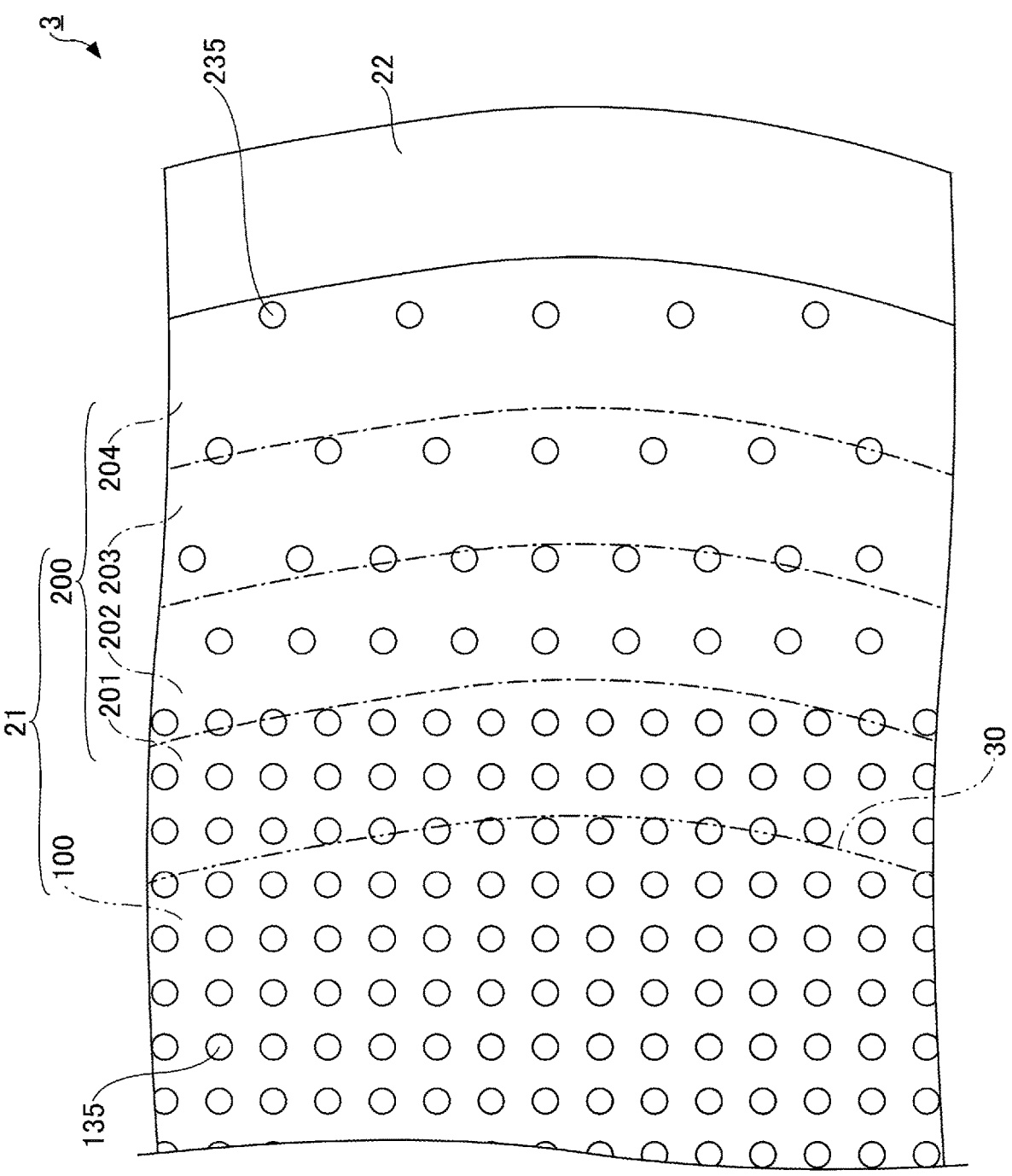
FIG. 8 is a top plan view of a wafer according to a third embodiment.
Figure 9:
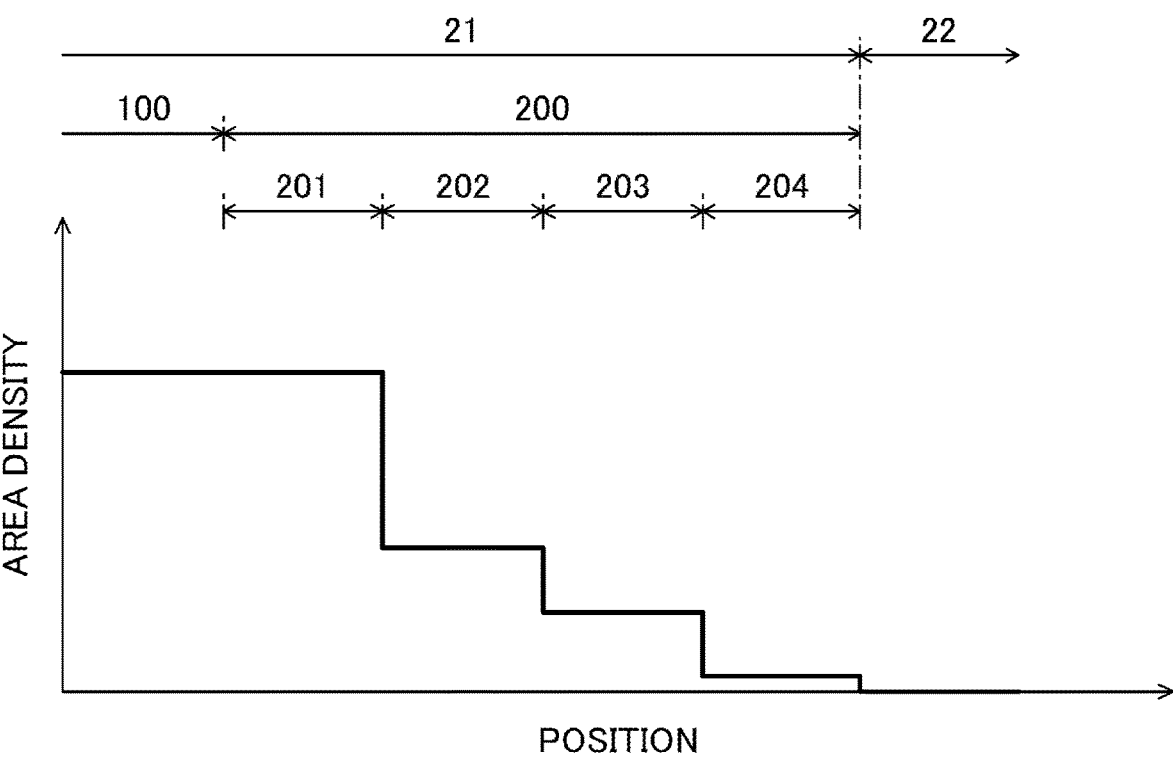
FIG. 9 is a diagram illustrating a distribution of area densities of conductive bumps in the wafer according to the third embodiment.

Next, a third embodiment is described. The third embodiment is different from the first embodiment and the second embodiment in, for example, the arrangement of the second conductive bumps 235. FIG. 8 is a top plan view of a wafer 3 according to the third embodiment. FIG. 9 is a diagram illustrating a distribution of area densities of conductive bumps in the wafer 3 according to the third embodiment. FIG. 8 corresponds to the top plan view of FIG. 2.

Referring to FIGS. 8 and 9, the ineffective area 200 includes a first annular area 201, a second annular area 202, a third annular area 203, and a fourth annular area 204. In a plan view, the entirety of the inner edge of the first annular area 201 contacts the entirety of the outer edge of the effective area 100. In a plan view, the entirety of the inner edge of the second annular area 202 contacts the entirety of the outer edge of the first annular area 201. In a plan view, the entirety of the inner edge of the third annular area 203 contacts the entirety of the outer edge of the second annular area 202. In a plan view, the entirety of the inner edge of the fourth annular area 204 contacts the entirety of the outer edge of the third annular area 203. In a plan view, the entirety of the outer edge of the fourth annular area 204 contacts the entirety of the inner edge of the bump non-formation area 22.

In the first annular area 201, the area density, the number density, and the pitch of the second electrode pads 230 are substantially uniform, and the area density, the number density, and the pitch of the second conductive bumps 235 are substantially uniform. The area density, the number density, and the pitch of the second electrode pads 230 and the area density, the number density, and the pitch of the second conductive bumps 235 in the first annular area 201 are equal or approximately equal to the area density, the number density, and the pitch of the first electrode pads 130 and the area density, the number density, and the pitch of the first conductive bumps 135, respectively, in the effective area 100.

In the second annular area 202, the area density, the number density, and the pitch of the second electrode pads 230 are substantially uniform, and the area density, the number density, and the pitch of the second conductive bumps 235 are substantially uniform. The pitch of the second electrode pads 230 and the pitch of the second conductive bumps 235 in the second annular area 202 are approximately 150% of the pitch of the first electrode pads 130 and the pitch of the first conductive bumps 135, respectively, in the effective area 100. The area density and the number density of the second electrode pads 230 and the area density and the number density of the second conductive bumps 235 in the second annular area 202 are approximately 44% of the area density and the number density of the first electrode pads 130 and the area density and the number density of the first conductive bumps 135, respectively, in the effective area 100.

In the third annular area 203, the area density, the number density, and the pitch of the second electrode pads 230 are substantially uniform, and the area density, the number density, and the pitch of the second conductive bumps 235 are substantially uniform. The pitch of the second electrode pads 230 and the pitch of the second conductive bumps 235 in the third annular area 203 are approximately 200% of the pitch of the first electrode pads 130 and the pitch of the first conductive bumps 135, respectively, in the effective area 100. The area density and the number density of the second electrode pads 230 and the area density and the number density of the second conductive bumps 235 in the third annular area 203 are approximately 25% of the area density and the number density of the first electrode pads 130 and the area density and the number density of the first conductive bumps 135, respectively, in the effective area 100.

In the fourth annular area 204, the area density, the number density, and the pitch of the second electrode pads 230 are substantially uniform, and the area density, the number density, and the pitch of the second conductive bumps 235 are substantially uniform. The pitch of the second electrode pads 230 and the pitch of the second conductive bumps 235 in the fourth annular area 204 are approximately 250% of the pitch of the first electrode pads 130 and the pitch of the first conductive bumps 135, respectively, in the effective area 100. The area density and the number density of the second electrode pads 230 and the area density and the number density of the second conductive bumps 235 in the fourth annular area 204 are approximately 16% of the area density and the number density of the first electrode pads 130 and the area density and the number density of the first conductive bumps 135, respectively, in the effective area 100.

Thus, according to the third embodiment, in a plan view, the area density and the number density of the second electrode pads 230 and the area density and the number density of the second conductive bumps 235 in the ineffective area 200 gradually decrease as a distance from the effective area 100 increases. That is, in a plan view, the area density and the number density of the second electrode pads 230 and the area density and the number density of the second conductive bumps 235 in the ineffective area 200 gradually decrease in a radial direction of the substrate 10 (away from the effective area 100).

In other respects, the third embodiment may be equal to the first embodiment.

The third embodiment as well can produce the same effects as the first embodiment. Furthermore, because the area density and the number density of the second conductive bumps 235 decreases stepwise as a distance from the effective area 100 increases, current density in the ineffective area 200 slowly changes when forming the first copper layer 132 and the second copper layer 232 and also when forming the first solder layer 133 and the second solder layer 233. Accordingly, the height of the second conductive bumps 235 can be more easily adjusted to the same or approximately the same height as the first conductive bumps 135. This makes it easier to reduce the remaining of the resist layer 300, which is used to form the first conductive bumps 135 and the second conductive bumps 235.

The area density of the second conductive bumps 235 in the ineffective area 200 is, for example, 5% to 80%, preferably 10% to 70%, and more preferably 20% to 60% of the area density of the first conductive bumps 135 in the effective area 100. If the area density of the second conductive bumps 235 in the ineffective area 200 is excessively low, current density may increase during electroplating near the outer edge of the effective area 100 unless the ineffective area 200 is widened. Widening the ineffective area 200, however, would reduce yield. If the area density of the second conductive bumps 235 in the ineffective area 200 is excessively high, the remaining of the resist layer 300 in the ineffective area 200 may be less reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject matter described herein may be set out non-exhaustively in the following numbered clauses:

1. A method of manufacturing a wafer, including:
forming a plurality of conductive bumps on a surface of a substrate such that, in a plan view from a direction perpendicular to said surface of the substrate, an area density of the conductive bumps is higher in a first area than in a second area around the first area in said surface of the substrate, the first area having a plurality of effective chip areas arranged therein.
2. The method of clause 1, wherein
the conductive bumps include a plurality of first conductive bumps in the first area and a plurality of second conductive bumps in the second area, and
an area density of the second conductive bumps in the second area is lower than an area density of the first conductive bumps in the first area in the plan view.

What is claimed is:
1. A wafer comprising:
a substrate; and
a plurality of conductive bumps on a surface of the substrate,
wherein the conductive bumps include a plurality of first conductive bumps in a first area in said surface of the substrate and a plurality of second conductive bumps in a second area around the first area in said surface of the substrate, the first area having a plurality of effective chip areas arranged therein, the effective chip areas being chip areas out of which semiconductor chips are to be cut as products, the first conductive bumps being connected to a semiconductor integrated circuit and the second conductive bumps being connected to no semiconductor integrated circuit,
in a plan view from a direction perpendicular to said surface of the substrate, an area density of the second conductive bumps in the second area is lower than an area density of the first conductive bumps in the first area, and
the area density of the second conductive bumps in the second area continuously decreases at a constant rate as a distance from the first area increases.
2. The wafer as claimed in claim 1, wherein the area density of the second conductive bumps in the second area is 5% to 80% of the area density of the first conductive bumps in the first area.
3. The wafer as claimed in claim 1, wherein each of the first conductive bumps and each of the second conductive bumps are equal in equivalent circle diameter in the plan view.
4. The wafer as claimed in claim 1, wherein a number density of the second conductive bumps in the second area is lower than a number density of the first conductive bumps in the first area in the plan view.
5. The wafer as claimed in claim 1, wherein each of the conductive bumps includes a copper pillar.
6. The wafer as claimed in claim 1, wherein the conductive bumps are provided one on each of a plurality of electrode pads on the substrate.
7. The wafer as claimed in claim 6, wherein the electrode pads include aluminum.
8. The wafer as claimed in claim 6, wherein the conductive bumps include a seed layer on the electrode pads.
9. The wafer as claimed in claim 8, wherein the seed layer includes copper, titanium, chromium, tungsten, or an alloy of any combination thereof.
10. The wafer as claimed in claim 1, wherein
the substrate has a circular shape, and
an annular third area devoid of conductive bumps are provided around the second area in said surface of the substrate.

11. The wafer as claimed in claim 1, wherein
the substrate has a diameter of 200 mm or 300 mm, and
the second area has a radial dimension of 3 mm to 10 mm.

* * * * *